United States Patent
Yeh et al.

(10) Patent No.: US 8,415,254 B2
(45) Date of Patent: Apr. 9, 2013

(54) METHOD FOR REMOVING DUMMY POLY IN A GATE LAST PROCESS

(75) Inventors: Matt Yeh, Hsinchun (TW); Fan-Yi Hsu, Toufen Town, Miaoli County (TW); Shun Wu Lin, Taichung (TW); Shu-Yuan Ku, Hsin-Chu (TW); Hui Ouyang, Chubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 820 days.

(21) Appl. No.: 12/275,082

(22) Filed: Nov. 20, 2008

(65) Prior Publication Data

US 2010/0124823 A1     May 20, 2010

(51) Int. Cl.
*H01L 21/302* (2006.01)

(52) U.S. Cl.
USPC ........... 438/753; 438/296; 438/651; 438/655; 438/682; 134/1.3; 216/99

(58) Field of Classification Search .................. 438/296, 438/651, 655, 682, 753; 257/E21.619, E21.546; 134/1.3; 216/99
See application file for complete search history.

(56) References Cited

U.S. PATENT DOCUMENTS

| | | | |
|---|---|---|---|
| 6,354,309 B1 * | 3/2002 | Arndt et al. | 134/1.3 |
| 6,569,766 B1 * | 5/2003 | Hamanaka et al. | 438/683 |
| 6,828,205 B2 * | 12/2004 | Tsai et al. | 438/313 |

OTHER PUBLICATIONS

Zhang et al. J. Vac. Sci. & Technol. B 21(6), Nov./Dec. (2003), pp. 2590-2598.*
Kim et al. IEEE Transactions on Semiconductor Manufacturing, vol. 17, No. 3, Aug. (2004), pp. 261-266.*

* cited by examiner

*Primary Examiner* — Lan Vinh
*Assistant Examiner* — Maki Angadi
(74) *Attorney, Agent, or Firm* — Haynes and Boone, LLP

(57) ABSTRACT

A method is provided for fabricating a semiconductor device. The method includes removing a silicon material from a gate structure located on a substrate through a cycle including: etching the silicon material to remove a portion thereof, where the substrate is spun at a spin rate, applying a cleaning agent to the substrate, and drying the substrate; and repeating the cycle, where a subsequent cycle includes a subsequent spin rate for spinning the substrate during the etching and where the subsequent spin rate does not exceed the spin rate of the previous cycle.

20 Claims, 9 Drawing Sheets

METHOD FOR REMOVING DUMMY POLY IN A GATE LAST PROCESS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. Metal-oxide semiconductor (MOS) transistors have typically been formed with polysilicon gate electrodes. Polysilicon material has been used due to its thermal resistive properties during high temperature processing, which allows it to be annealed at high temperatures along with source/drain structures. Furthermore, polysilicon's ability to block the ion implantation of doping atoms into the channel region is advantageous, as it allows for the easy formation of self aligned source/drain structures after gate patterning is completed.

However, there has been a desire to fabricate these devices with a metal material for the gate electrode and a high-k dielectric for the gate dielectric. It may be advantageous to replace the polysilicon gate electrode with a metal gate electrode to improve device performance as feature sizes continue to decrease. One process of forming a metal gate is termed a "gate last" process in which the final metal gate is fabricated "last" which allows for reduced number of subsequent processes on the metal gate, including high temperature processing. In the gate last process, a dummy poly gate is initially formed and may continue with processing until deposition of an interlayer dielectric (ILD). A chemical mechanical polishing (CMP) is typically performed on the ILD layer to expose the dummy poly gates. The dummy poly gate may then be removed and replaced with a true metal gate. However, traditional methods for removing the dummy poly gate have been time consuming, costly, and ineffective. Therefore, what is needed is a novel method for removing the dummy poly gate for a gate last process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
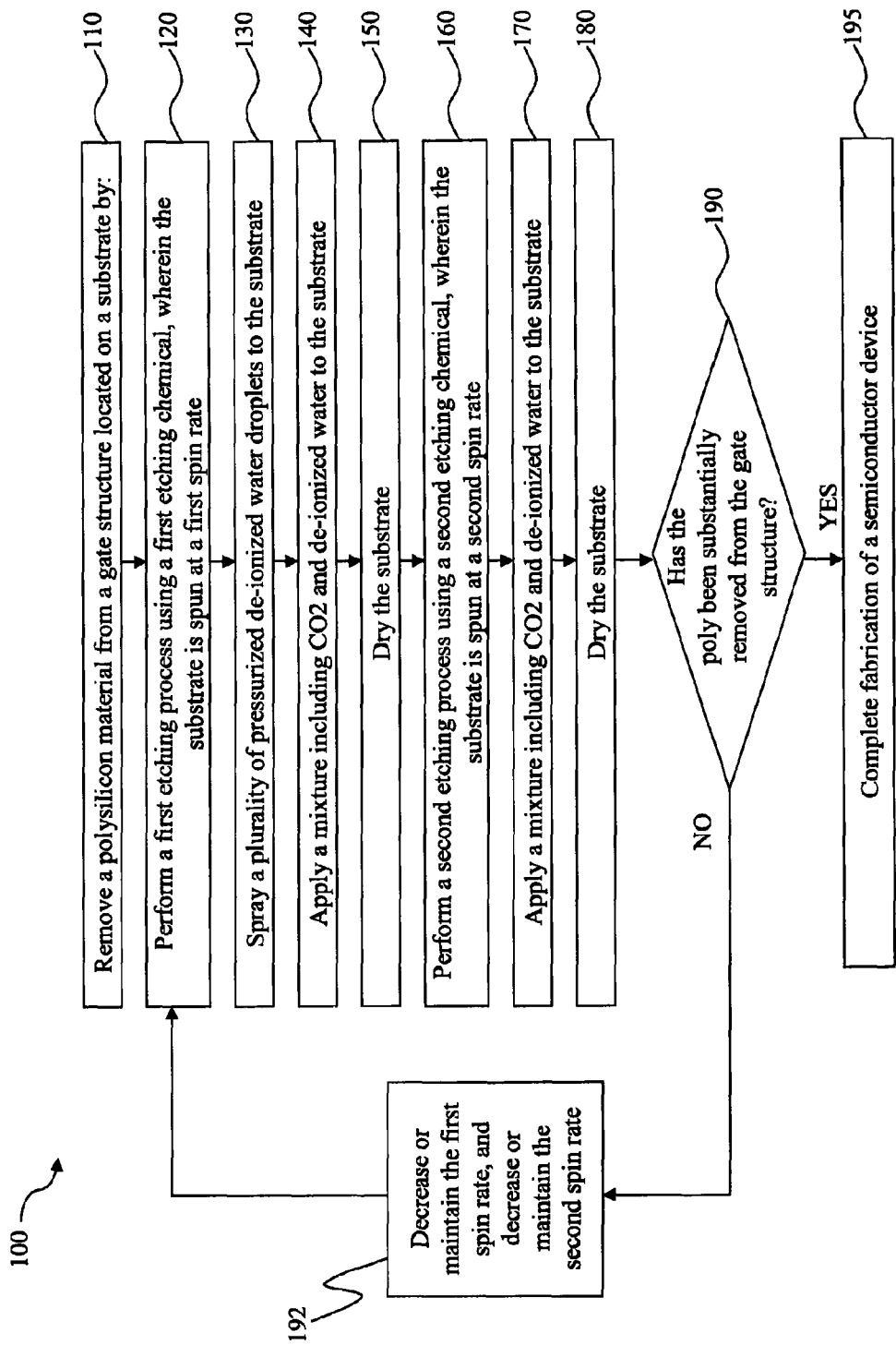
FIG. 1 is a flowchart of a novel method for removing the dummy poly gate in a gate last process according to various aspects of the present disclosure.

Illustrated in FIG. 1 is a flowchart of a method 100 for fabricating a semiconductor device in a gate last process according to various aspects of the present disclosure. FIGS. 2A to 2H illustrate cross-sectional views of one embodiment of a semiconductor device 200 at various stages of fabrication according to the method 100 of FIG. 1. It is understood that FIGS. 2A to 2H have been simplified for a better understanding of the inventive concepts of the present disclosure. The semiconductor device 200 may be an integrated circuit, or portion thereof, that may comprise static random access memory (SRAM) and/or other logic circuits, passive components such as resistors, capacitors, and inductors, and active components such as P-channel field effect transistors (pFET), N-channel FET (nFET), metal-oxide semiconductor field effect transistors (MOSFET), or complementary metal-oxide semiconductor (CMOS) transistors. It should be noted that some features of the semiconductor device 200 may be fabricated with a CMOS process flow. Accordingly, it is understood that additional processes may be provided before, during, and after the method 100 of FIG. 1, and that some other processes may only be briefly described herein.

Figure 2A:
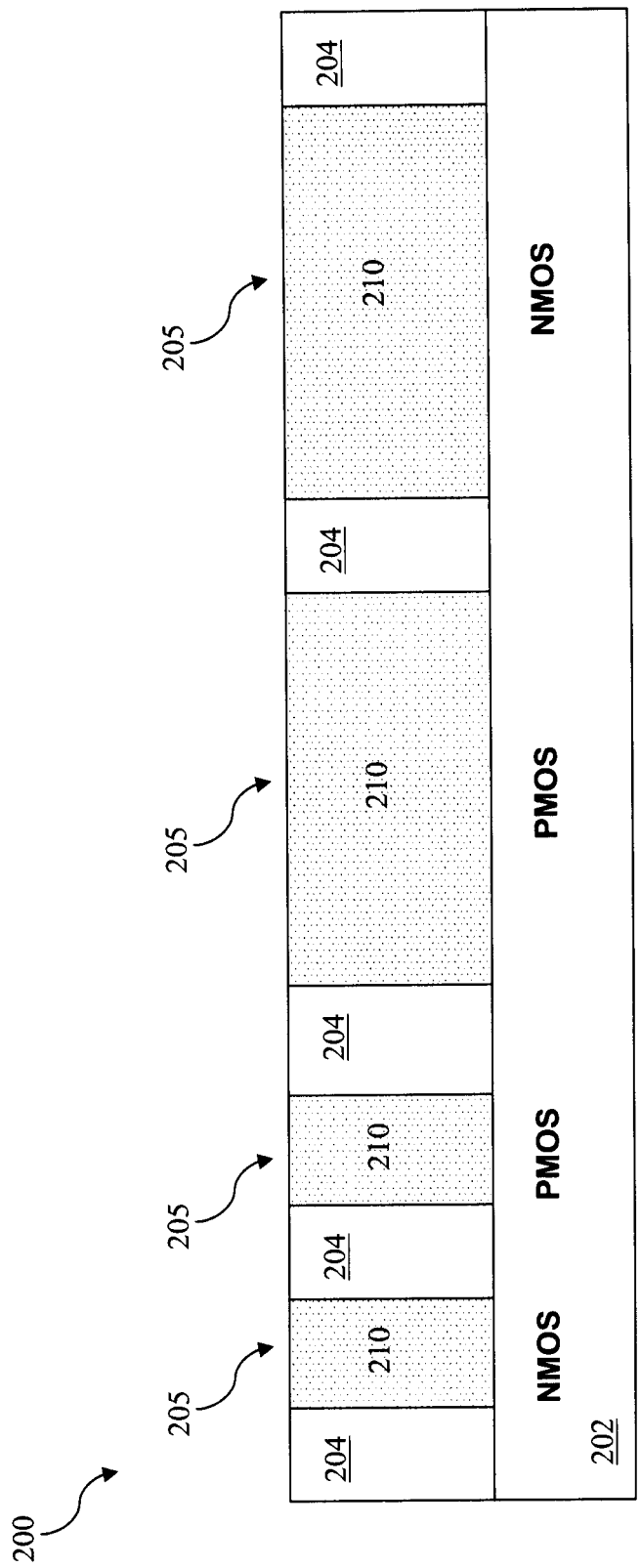
FIGS. 2A to 2H are cross-sectional views of a semiconductor device at various stages of fabrication according to the method of FIG. 1.

Referring to FIG. 1, the method 100 begins with block 110 in which a polysilicon material is to be removed from a dummy gate located on a substrate. Referring also to FIG. 2A, the semiconductor device 200 may include a substrate 202. In the present embodiment, the substrate 202 includes a silicon substrate (e.g. wafer) in crystalline structure. The substrate 202 may include various doping configurations depending on design requirements as is known in the art (e.g., p-type substrate or n-type substrate). Additionally, the substrate 202 may include various doped regions such as p-type wells (p-wells) or n-type wells (n-wells). The substrate 202 may also include other elementary semiconductors such as germanium and diamond. Alternatively, the substrate 202 may include a compound semiconductor such as, silicon carbide, gallium arsenide, indium arsenide, or indium phosphide. Further, the substrate 202 may optionally include an epitaxial layer (epi layer), may be strained for performance enhancement, and may include a silicon-on-insulator (SOI) structure.

The semiconductor device 200 may further include isolation structures such as shallow trench isolation (STI) features formed in the substrate 202 to isolate one or more devices from each other. The STI features may include silicon oxide, silicon nitride, silicon oxynitride, fluoride-doped silicate (FSG), and/or a low-k dielectric material known in the art. Other isolation methods and/or features are possible in lieu of or in addition to STI. The STI features may be formed using processes such as reactive ion etch (RIE) of the substrate 202 to form trenches which are then filled with an insulator material using deposition processes followed by a chemical-mechanical-polishing (CMP) process.

It is also understood that additional processing steps may be performed prior to the removal of polysilicon from the dummy gates. For example, an interfacial layer (e.g., thermal oxide or chemical oxide) may have been formed on the substrate 202 by a suitable technique. Also, a high-k dielectric layer may have been formed over the interfacial layer oxide. The high-k dielectric layer may include hafnium oxide ($HfO_2$). Alternatively, the high-k dielectric layer may optionally include other high-k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The high-k dielectric layer may be formed by atomic layer deposition (ALD), chemical vapor deposition (CVD), or other suitable technique. Further, a metal-1 film may have been formed as a wet etch stop layer or barrier layer over the high-k dielectric layer. The metal-1 film may be formed by CVD, PVD, ALD, or other suitable technique. The material used for the metal-1 film layer may include TaN, TaSiN, W, TaC, TaCN, TiAlN, Al, TiN, and Ti.

Moreover, additional processing steps may be performed, including depositing a polysilicon layer (poly layer), depositing a hard mask layer, gate patterning, growing SiGe features, forming a plurality of lightly doped source and drain regions (LDD regions), forming sidewall spacers, forming a plurality of source and drain regions, forming silicide features (e.g., NiSi), and forming an inter-layer dielectric (ILD) 204. In a gate last process, a chemical mechanical polishing (CMP) may be performed on the ILD 204 to expose the dummy poly gates for removal.

Still referring to FIG. 2A, a plurality of gate structures 205 each having a dummy gate structure 210 may be formed on the substrate 202. The formation of the gate structures 205 may include forming various material layers discussed above, and patterning (e.g., gate etching) the various material layers to form the gate structures 205 that may be part of NMOS or PMOS devices, for example. The dummy gate structures 210 may be formed of the poly layer. The dummy poly gate 210 may include a thickness ranging from about 400 to about 1000 angstrom (Å). In the present embodiment, the dummy poly gate 210 has a thickness of about 700 angstroms. In a gate last process, the dummy poly gates 210 may be removed so that true metal gates may be formed in place of the dummy poly gates 210. However, some or all of the dummy poly gates 210 may be oxidized and as such may pose difficulties for removal. Further, it has been observed that problems have arisen with current methods of poly removal such as poly residues in the gate trench, chemical residues in the gate trench, contamination/particles on the substrate, long processing time, and low wafer throughput. The present embodiment of the invention provides a novel method 100 for the effective and efficient removal of the dummy poly gates 210. The method 100 implements a multi-cycle etching process for removing the dummy poly gates 210. Each cycle includes various processes that are described in detail below.

Figure 2B:
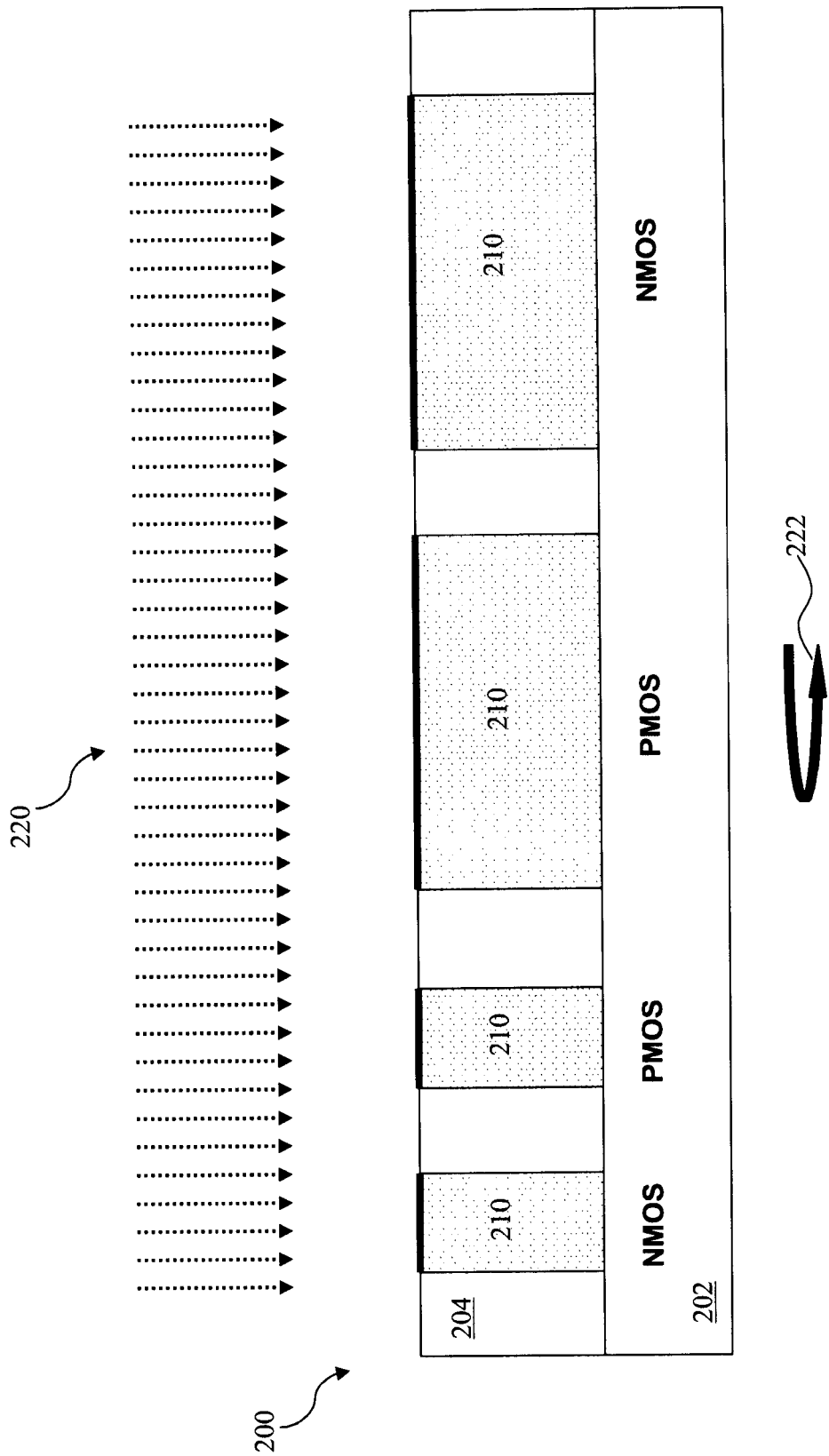

The method 100 continues with block 120 in which a first etching process having an associated etching chemical as well as an associated spin rate may be performed. Referring now to FIG. 2B, an etching process 220 is performed on the substrate 202 to remove the dummy poly gates 210. The etching process 220 uses a solution having a fluoride compound as an etching chemical. This type of etching chemical (i.e. the solution that contains the fluoride compound) is effective at removing a silicon oxide material. Silicon oxide may form over the dummy poly gates 210 by oxidation and may be referred to as a native oxide. The thickness of the native oxide may vary depending on several factors, such as, temperature, environment, and the amount of exposure.

Additionally, a hard mask layer (e.g., silicon oxide) may be formed over the poly layer prior to gate patterning. Following the CMP process on the ILD 204 to expose the dummy poly gates 210, a portion of the hard mask layer may remain on some of the dummy poly gates. Accordingly, silicon oxide of the hard mask layer may also be removed by the etching process 220. In the present embodiment, the etching chemical for the etching process 220 includes diluted hydrofluoric acid (DHF) solution having a ratio of about 1:500. The etching process 220 may be performed under a specified temperature for the etching chemical and for a specified time period. The temperature and time period may be adjusted to control the amount of material to be etched and may be determined by any suitable method. The substrate 202 may also be spun 222 during the etching process 220. In the present embodiment, the etching process 220 is performed at a temperature of about 23° C. and for a period of about 10 seconds, while the substrate 202 is spun 222 at a rate of about 1000 rotations per minute (rpm). It is understood that the specified spin rate is a mere example and that other spin rates may be used depending on various factors such as, the etchant composition, etchant flow rate, and dispenser position.

Figure 2C:
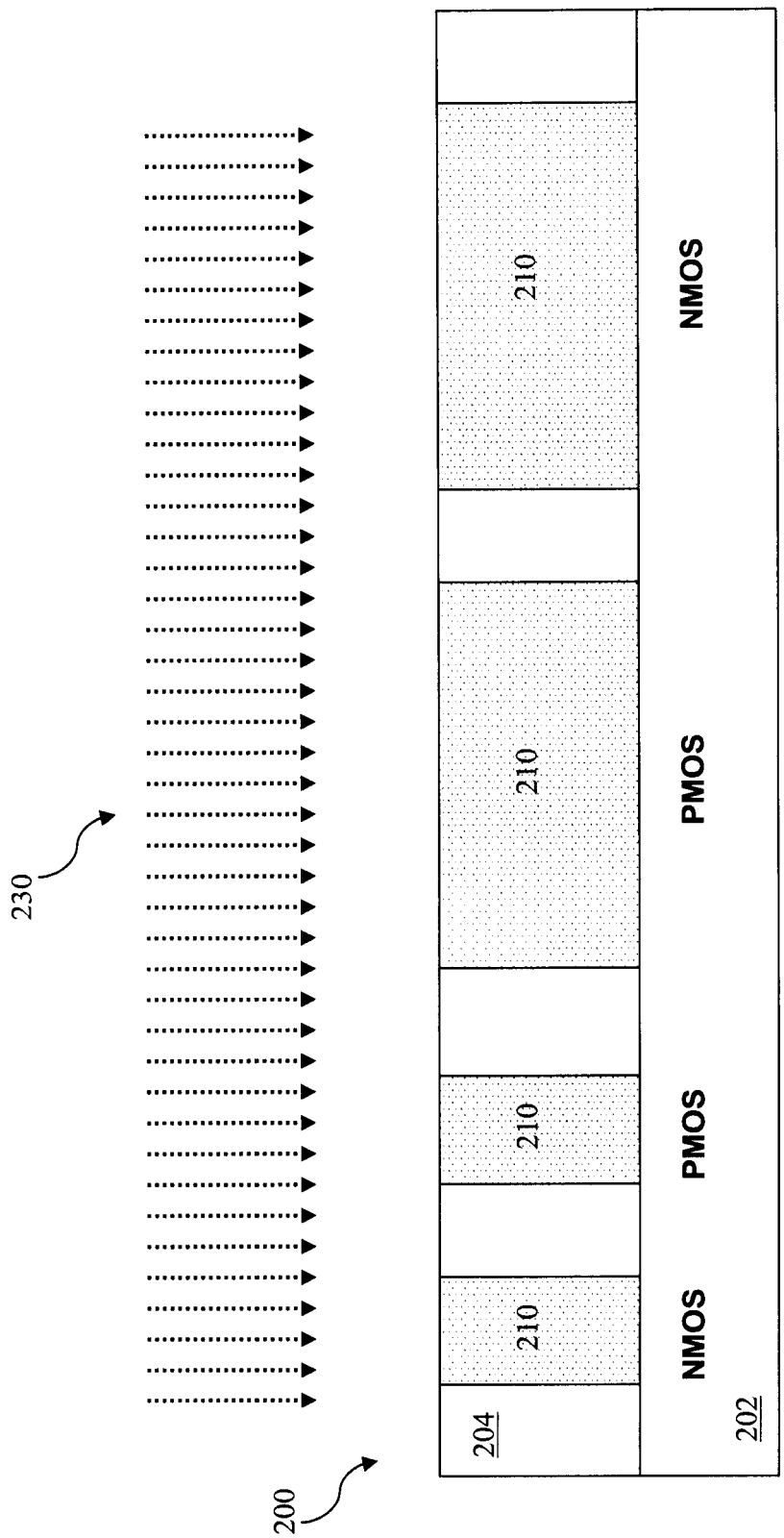

The method 100 continues with block 130 in which a plurality of pressurized de-ionized water droplets may be sprayed onto the substrate. Referring now to FIG. 2C, a spraying process 230 may be applied to the substrate 202 to remove residuals and/or particles (e.g., silicon oxide particles or silicon particles) remaining over the dummy poly gates 210 or over other areas of the substrate 202 from the etching process 220. These left-over residuals and/or particles may be considered as "defects." Here, the spraying process 230 removes these residuals and/or particles by pressurizing vaporized de-ionized water (DIW) droplets and spraying these droplets against the surface of substrate 202 including the dummy poly gates 210 so that the residuals and/or particles may be washed away. In the present embodiment, an "atomized spray" or "nano-spray" process may be used. The "nano-spray" process uses an inert gas that has a high flow rate (e.g., high pressured) to vaporize DIW into very small de-ionized droplets, which may then be used to physically remove the residuals and/or particles. The extent to which the DIW droplets are pressurized is determined by the flow rate of the inert gas. The higher the gas flow rate, the more effective the residual and/or particle removal becomes. The drawback of a high gas flow rate is that it may cause pattern damage to the substrate 202. Hence, a tradeoff analysis may be performed to determine the gas flow rate. In the present embodiment, the inert gas used is $N_2$. The flow rate for the $N_2$ gas is about 20 Liters per minute (L/min) to about 100 L/min. It is understood that other inert gases or inactive gases may be used instead of $N_2$.

Figure 2D:
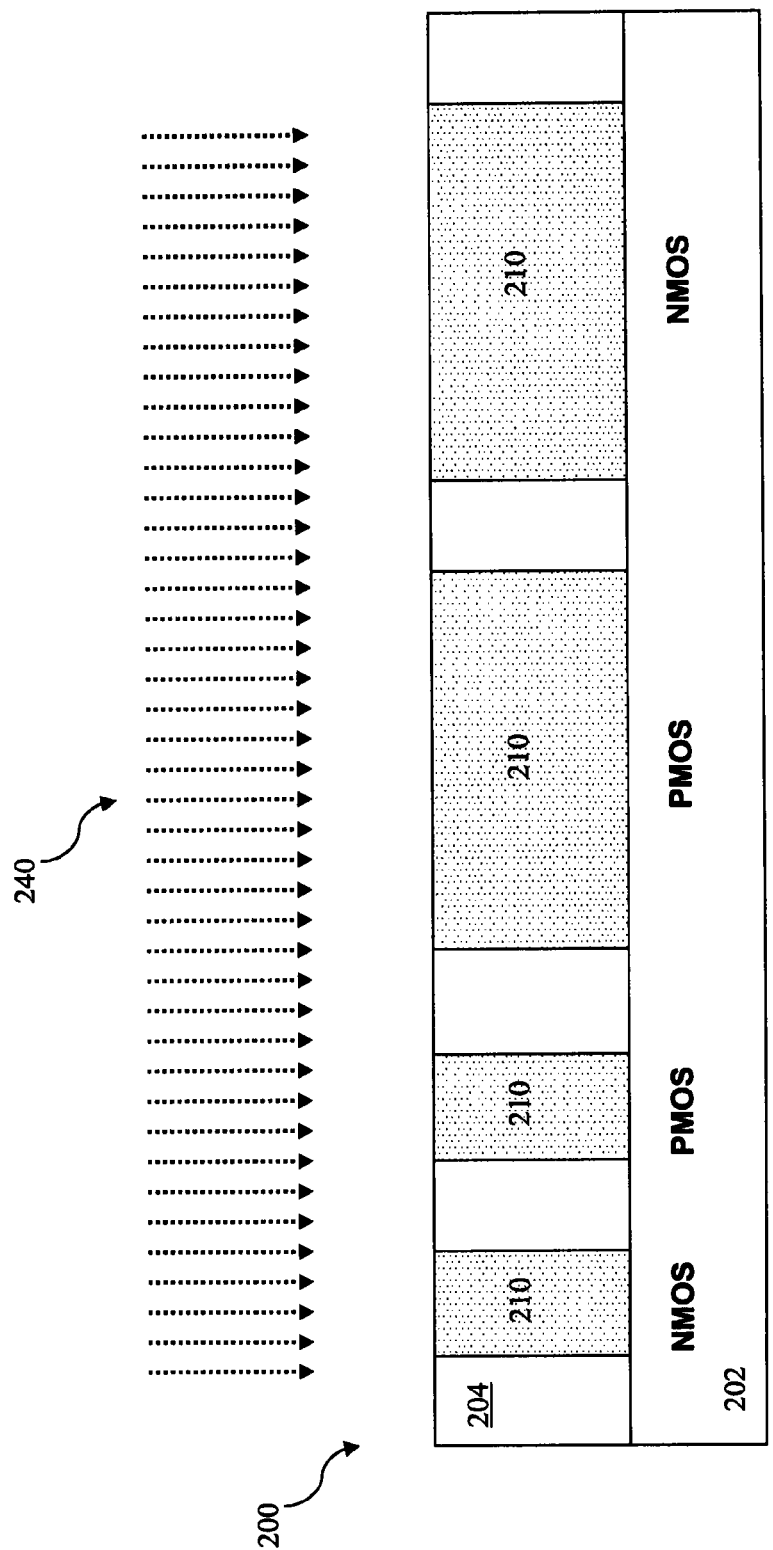

The method 100 continues with block 140 in which a mixture including $CO_2$ and DIW is applied to the substrate. Referring now to FIG. 2D, a rinsing process 240 is applied to the substrate 202 to remove chemical residues remaining on the substrate. In the rinsing process 240, a $CO_2$ gas is injected into de-ionized water (DIW) to form a light acidic solution. This acidic solution is effective for removing the chemical residues, which may include an alkali residue. The residues may have accumulated from prior processes. In the present embodiment, the solution having the $CO_2$-DIW mixture has a concentration of about 1 ppm to about 100 ppm.

Figure 2E:
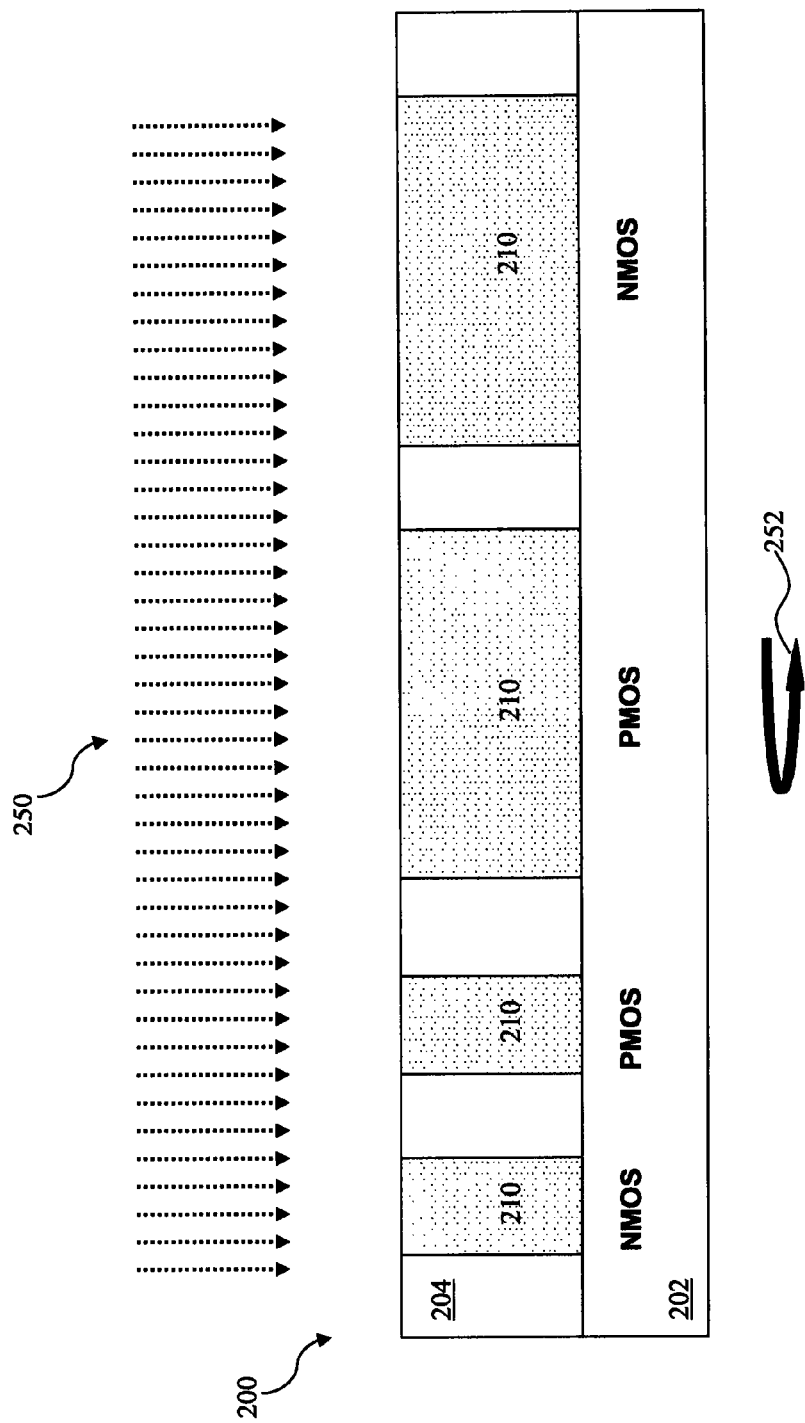

The method 100 continues with block 150 in which the substrate may be dried. Referring now to FIG. 2E, a drying process 250 may be performed on the substrate 202. The substrate 202 may be spun dried using an inert gas such as $N_2$ or other inactive gas as is known in the art. In the present embodiment, the substrate 202 is spun 252 at a rate of about 2,500 rpm although other spin rates may be used.

Figure 2F:
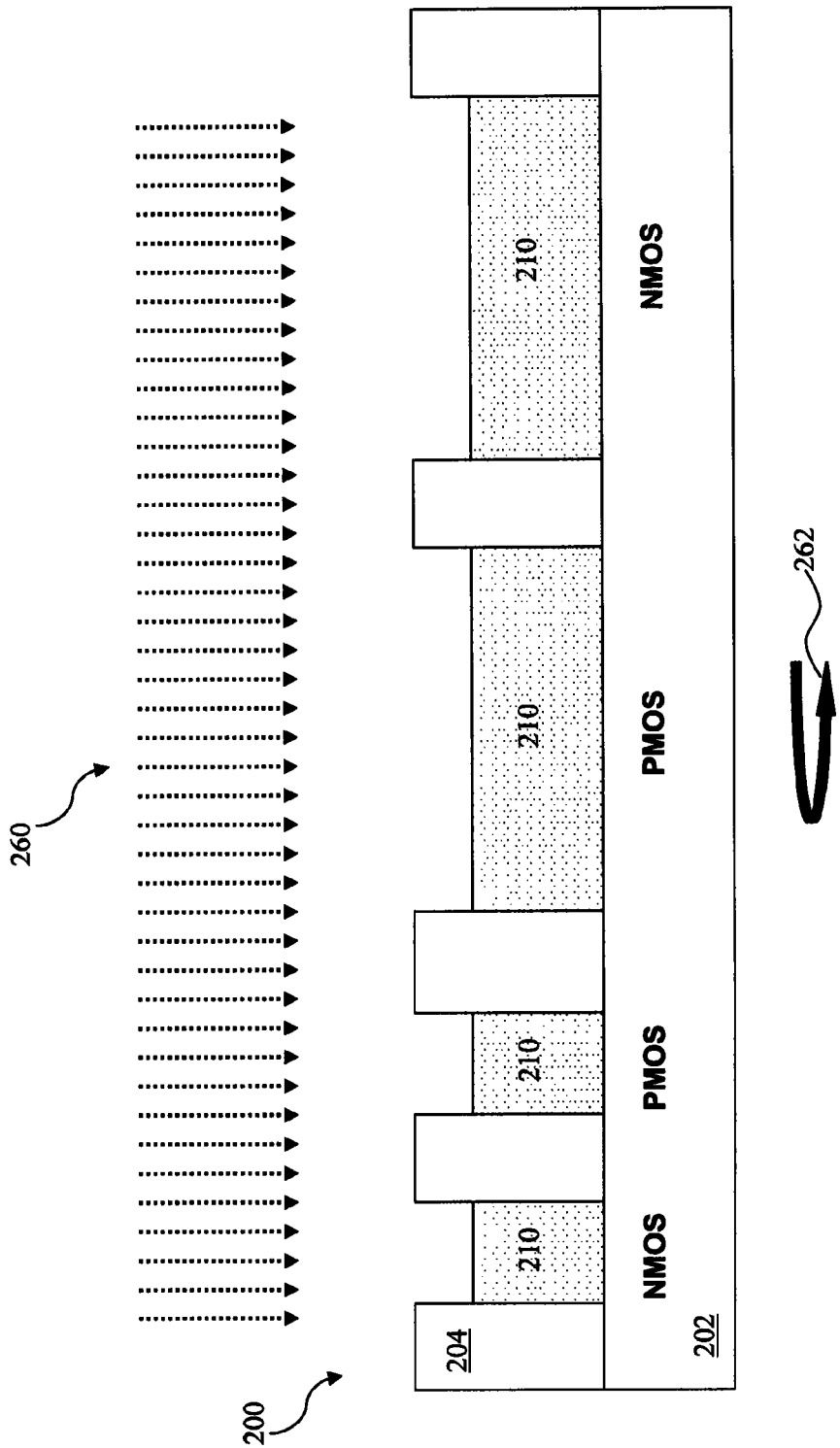

The method 100 continues with block 160 in which a second etching process having an associated etching chemical as well as an associated spin rate is performed to remove the poly. Referring now to FIG. 2F, an etching process 260 is performed on the substrate 202 to remove the poly 210. The etching process 260 uses a solution having an amine derivative as an etching chemical. The amine derivative may include one of $NH_4OH$, $NH_3(CH_3)OH$, $NH_2(CH_3)_2OH$, $NH(CH_3)_3OH$, $N(CH_3)_4OH$, or any combination thereof. The present embodiment uses $NH_4OH$ solution having a ratio of 1:100 as the etching chemical for the etching process 260. The etching process 260 is also performed under a specified temperature for the etching chemical and lasts for a specified time period. The temperature and time period may be adjusted to control the amount of material to be etched and may be determined by any suitable method. The substrate 202 may also be spun 262 during the etching process 260. In the present embodiment, the etching process 260 is performed at a temperature of about 50° C. and for a period of about 20 seconds, while the substrate 202 is spun 262 at a rate of about 1000 rpm. It is understood that the specified spin rate is a mere example and that other spin rates may be used depending on various factors such as, the etchant composition, etchant flow rate, and dispenser position.

Figure 2G:
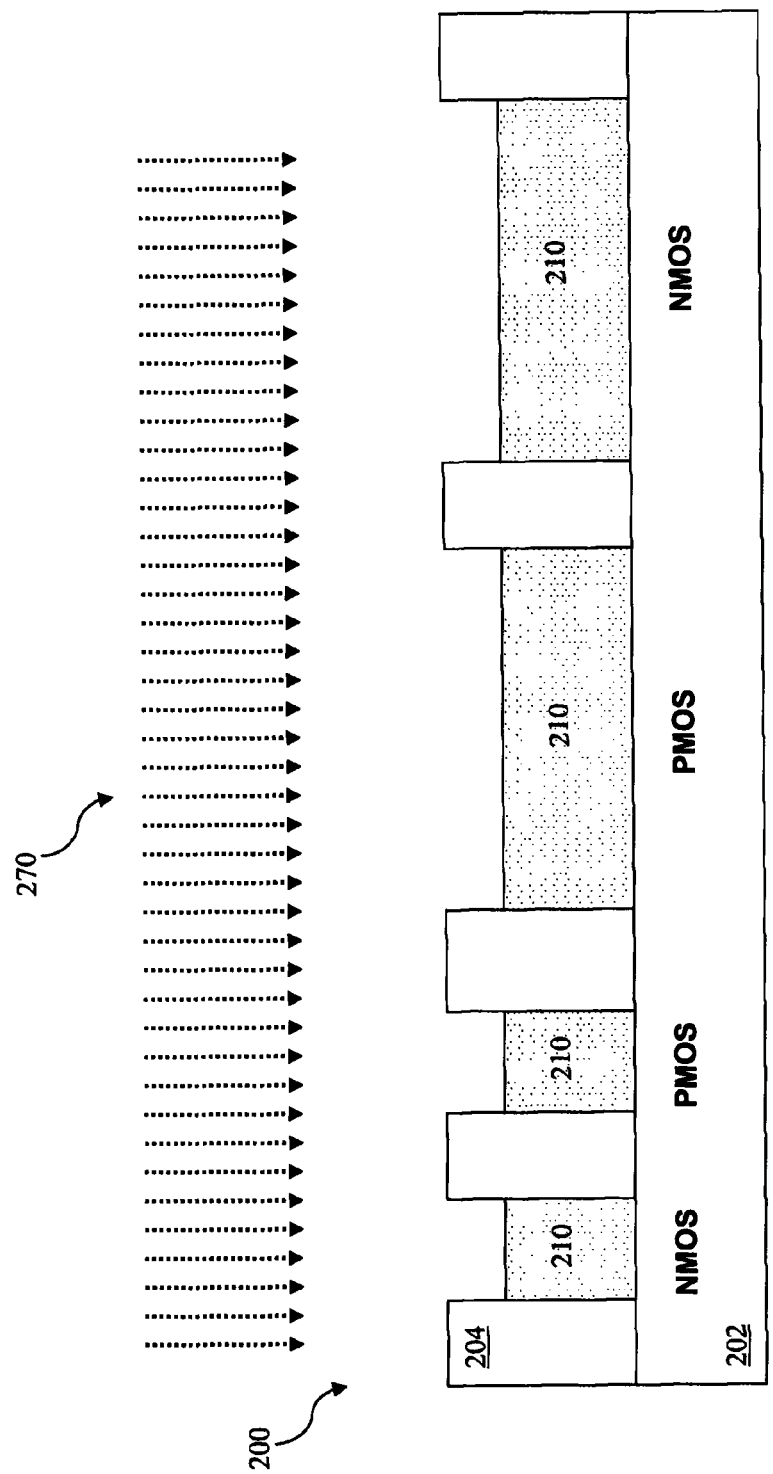

The method 100 continues with block 170 in which a mixture including $CO_2$ and DIW is applied to the substrate. Referring now to FIG. 2G, a rinsing process 270 is applied to the substrate 202 to remove chemical residues. In the rinsing process 270, a $CO_2$ gas is injected into DIW to form a light acidic solution. This acidic solution is effective for removing the chemical residues which may include an alkali residue. The residues may have accumulated from the prior etching process 260 or other processes. In the present embodiment, the solution having the $CO_2$-DIW mixture has a concentration of about 1 ppm to about 100 ppm. The residues that may be removed in the present embodiment includes $NH_4OH$ or TMAH residue.

Figure 2H:
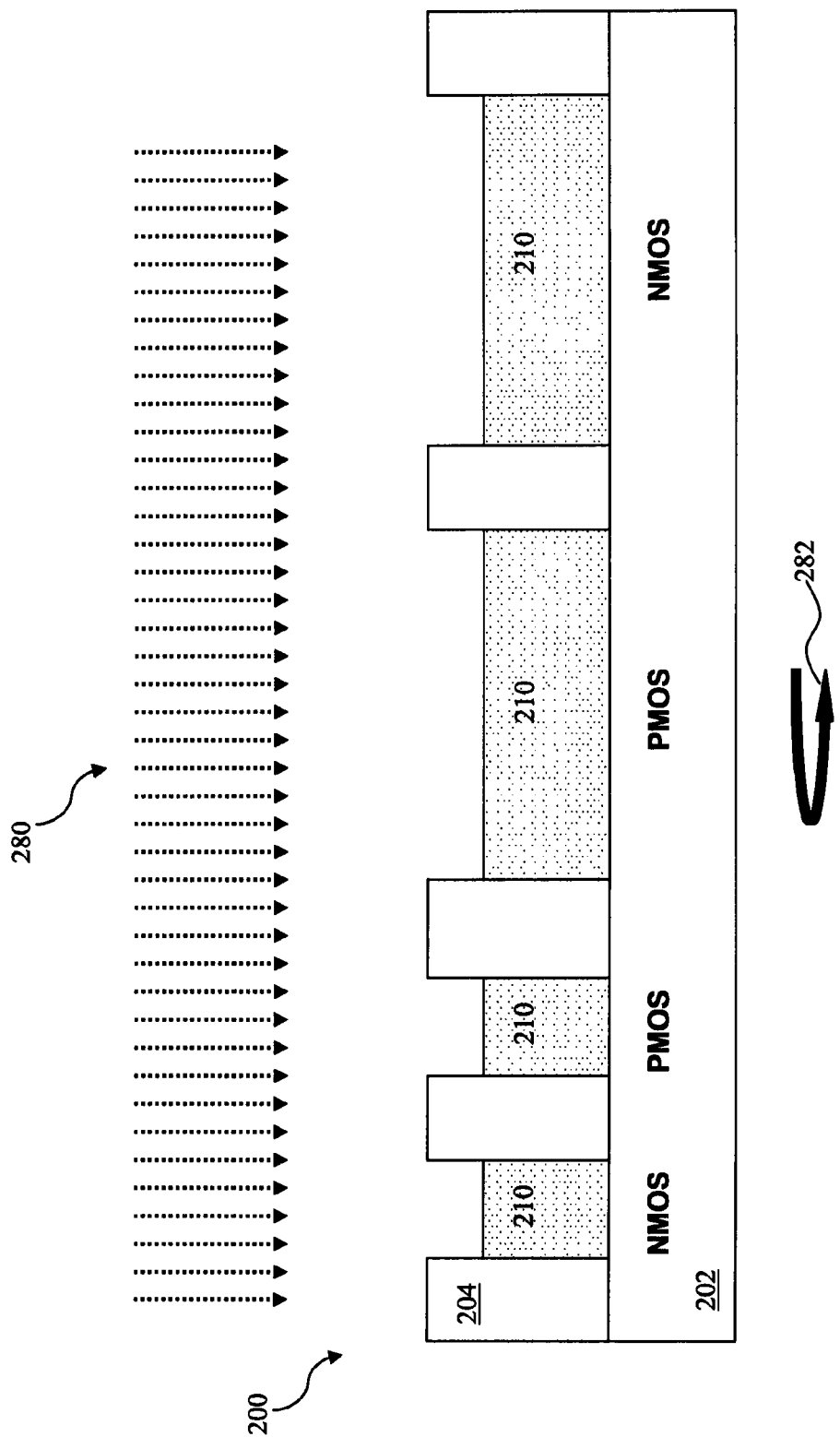

The method 100 continues with block 180 in which the substrate is dried. Referring now to FIG. 2H, a drying process 280 is performed on the substrate 202. The substrate 202 may be spun dried using an inert gas such as $N_2$ or other inactive gas as is known in the art. In the present embodiment, the substrate 202 is spun 282 at a rate of about 2,500 rpm although other spin rates may be used. It should be noted that the processes discussed in blocks 120 to 180 perform one cycle for etching a portion of the dummy poly gates 210. It has been observed that by performing multiple cycles instead of a single cycle etching process to remove the entire dummy poly gate, the overall process time may be significantly reduced thereby increasing throughput and the risk of generating defects such as poly residues, chemical residues, and other particles may be prevented.

The method 100 continues with block 190 in which a decision is made as to whether the poly has been substantially removed. If no, then the method 100 continues to block 192 in which the spin rates for the first etching process 220 (block 120) and second etching 260 process (block 160) may be maintained or decreased, and a subsequent cycle may be started with blocks 120 to 180. It may be advantageous to spin the substrate 202 at a lower spin rate for the subsequent cycle because trenches may begin forming in the gate structures 205. Thus, a lower spin rate may make it easier for the etching chemicals to substantially fill in the trenches to etch the polysilicon or native oxide. In some other embodiments, the spin rate for the subsequent cycle may be maintained as the prior cycle, depending on the need. Furthermore, the spin rate for the drying processes 250 (block 150) and 280 (block 180) may be adjusted as well.

In the present embodiment, it has been observed that the method 100 may include four (4) cycles to remove the dummy poly gates 210 from the gate structures 205. The spin rates for the etching processes 220 and 260 are about 1,000 rpm for the first cycle, about 800 rpm for the second cycle, about 500 rpm for the third cycle, and about 500 rpm for the fourth cycle. It is understood that the number of cycles may vary depending on the thickness of the polysilicon as well as the dimensions of the gate structure. Also, for the present embodiment, the spin rates for the drying process 250 and 280 are about 2,500 rpm for all four cycles. One advantage of the present embodiment is that each cycle may remove a portion of the poly, and the combination of the etching, cleaning, and drying processes may be effective in removing the portion of the poly. With multiple cycles, it has been observed that the dummy poly gates 210 may be completely removed and the total process time is reduced as compared to a conventional single cycle etching process. Further, the multiple cycles are effective in removing the native oxide layer that forms when the polysilion oxidizes, and removing the chemical residues and/or particles that remain following the etching processes or other processes. Moreover, the gradient spin rate (from high speed to low speed) for the etching processes is effective in accounting for the trench topography that forms following each cycle.

Coming back to block 190, if yes (the poly has been substantially removed from the gate structure), then the method 100 continues to block 195 in which fabrication of the semiconductor device 200 may be completed. For example, the semiconductor device 200 may undergo further processing, such as forming metal layers for the gate electrode of the gate structures 205, forming first contacts/vias, forming interconnect structures (e.g., lines and vias, metal layers, and interlayer dielectric that provide electrical interconnection to the device including the formed metal gate), forming passivation layers, etc. For example, a multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure.

In summary, a gate last process may be implemented to form metal gate structures. In such process, a poly material may be removed from a dummy gate so that a true metal gate may be formed. However, traditional methods to remove the poly may be inefficient, ineffective, and time consuming. The new method disclosed herein provides a method for the removal of the poly material in a dummy gate. The new method takes advantage of two or more cycles each including an etching, cleaning, and drying process. The combination of these processes are effective at removing a portion of the poly during each cycle. The poly may be substantially removed in two or more cycles, depending on the thickness of the poly, the dimensions of the gate structure as well as the process parameters. Hence, the method disclosed herein allows for effective removal of the poly while achieving a total reduction in process time. Also, the method disclosed herein is compatible with current CMOS technology process flow, and is easily integrated with current processing equipment and device technologies.

Thus provided is a method for fabricating a semiconductor device that includes removing a silicon material from a gate structure located on a substrate through a cycle including: etching the silicon material to remove a portion thereof, wherein the substrate is spun at a spin rate; applying a cleaning agent to the substrate; and drying the substrate, and repeating the cycle, where a subsequent cycle includes a subsequent spin rate for spinning the substrate during etching, and where the subsequent spin rate does not exceed the spin rate of the previous cycle.

Also provided is a method for fabricating a semiconductor device that includes removing a polysilicon material of a dummy gate structure located on a substrate through a cycle including: performing a first etching process using a first etching chemical, where the substrate is spun at a first spin rate, applying a cleaning agent to the substrate, performing a second etching process using a second etching chemical, where the substrate is spun at a second spin rate, and drying the wafer, and repeating the cycle, where a subsequent cycle includes decreasing or maintaining the first spin rate of the previous cycle and decreasing or maintaining the second spin rate of the previous cycle.

Also provided is a method for fabricating a semiconductor device that includes removing a polysilicon material of a dummy gate structure located on a substrate through a cycle including: performing a first etching process using a first etching chemical; spraying a plurality of pressurized de-ionized water (DIW) droplets to the substrate; applying a mixture including $CO_2$ and DIW to the substrate; drying the substrate; and performing a second etching process using a second etching chemical, and repeating the cycle until substantially all of the polysilicon material is removed.

While the preceding description shows and describes one or more embodiments, it will be understood by those skilled in the art that various changes in form and detail may be made therein without departing from the spirit and scope of the present disclosure. For example, although the methods disclosed herein implement a "gate last" approach, the methods disclosed herein may be used in a hybrid process in which one type of metal gate is formed in a "gate first" process flow and the other type of metal gate is formed in a "gate last" process flow. Further, additional etching, cleaning, rinsing, and drying steps may be implemented in one or more of the cycles to remove the dummy poly gate. Moreover, the etching chemicals disclosed above are mere examples and it is contemplated that other etching chemicals suitable for removing oxides, polysilicon, or other materials typically found in semiconductor manufacturing may be used as well.

What is claimed is:

1. A method of fabricating a semiconductor device comprising:
    removing a silicon-containing semiconductor material from a gate structure located on a substrate through a cycle including:
        etching the silicon-containing semiconductor material to remove a portion thereof, wherein the substrate is spun at a spin rate;
        applying a cleaning agent to the substrate; and
        drying the substrate; and
    repeating the cycle, wherein a subsequent cycle includes a subsequent spin rate for spinning the substrate during the etching and wherein the subsequent spin rate does not exceed the spin rate of the previous cycle.

2. The method of claim 1, wherein the etching the silicon material includes a first etching process using a first etching chemical and a second etching process using a second etching chemical.

3. The method of claim 2, wherein the first etching chemical includes a fluoride compound.

4. The method of claim 3, wherein the first etching chemical includes a diluted hydrofluoric acid (DHF) having a ratio of about 1:500.

5. The method of claim 4, wherein the first etching process is performed with a temperature of about 23° C. and for a period of about 10 seconds.

6. The method of claim 2, wherein the second etching chemical includes an amine derivative that includes one of $NH_4OH$, $NH_3(CH_3)OH$, $NH_2(CH_3)_2OH$, $NH(CH_3)_3OH$, $N(CH_3)_4OH$, and combinations thereof.

7. The method of claim 6, wherein the second etching chemical includes $NH_4OH$ solution having a ratio of about 1:100.

8. The method of claim 7, wherein the second etching process is performed with a temperature of about 50° C. and for a period of about 20 seconds.

9. The method of claim 1, wherein the applying a cleaning agent to the substrate includes one of:
    spraying a plurality of pressurized de-ionized water (DIW) droplets to the substrate;
    applying a mixture including $CO_2$ and DIW to the substrate; and
    combination thereof.

10. A method of fabricating a semiconductor device comprising:
    removing a polysilicon-containing semiconductor material of a dummy gate structure located on a substrate through a cycle including:
        performing a first etching process using a first etching chemical, wherein the substrate is spun at a first spin rate;
        applying a cleaning agent to the substrate;
        performing a second etching process using a second etching chemical, wherein the substrate is spun at a second spin rate; and
        drying the substrate; and
    repeating the cycle, wherein a subsequent cycle includes decreasing or maintaining the first spin rate of the previous cycle, and decreasing or maintaining the second spin rate of the previous cycle.

11. The method of claim 10, wherein the first etching chemical includes a fluoride compound.

12. The method of claim 11, wherein the second etching chemical includes an amine derivative.

13. The method of claim 10, wherein the applying a cleaning agent to the substrate includes one of:
    spraying a plurality of pressurized de-ionized water (DIW) droplets to the substrate;
    applying a mixture including $CO_2$ and DIW to the substrate; and
    combination thereof.

14. The method of claim 10, wherein an etching process time for the first etching process is less than an etching process time for the second etching process.

15. A method of fabricating a semiconductor device comprising:
    removing a polysilicon-containing semiconductor material of a dummy gate structure located on a substrate through a cycle including:
        performing a first etching process using a first etching chemical;

spraying a plurality of pressurized de-ionized water (DIW) droplets to the substrate;
applying a mixture including $CO_2$ and DIW to the substrate;
drying the substrate; and
performing a second etching process using a second etching chemical; and repeating the cycle until substantially all of the polysilicon material is removed.

16. The method of claim 15, wherein the spraying includes a DIW nano-spray process using an inert gas flow rate ranging from about 20 L/min to about 100 L/min to vaporize the DIW.

17. The method of claim 15, wherein the first etching chemical includes a fluoride compound.

18. The method of claim 15, wherein the second etching chemical includes an amine derivative.

19. The method of claim 15, wherein the repeating the cycle includes decreasing the first spin rate for the first etching process and decreasing the second spin rate for the second etching process.

20. The method of claim 15, wherein the cycle further includes, after performing the second etching process:
applying another mixture including $CO_2$ and DIW to the substrate; and
drying the substrate again.

* * * * *